(12) United States Patent
Yang et al.

(10) Patent No.: US 7,019,366 B1
(45) Date of Patent: Mar. 28, 2006

(54) ELECTROSTATIC DISCHARGE PERFORMANCE OF A SILICON STRUCTURE AND EFFICIENT USE OF AREA WITH ELECTROSTATIC DISCHARGE PROTECTIVE DEVICE UNDER THE PAD APPROACH AND ADJUSTMENT OF VIA CONFIGURATION THERETO TO CONTROL DRAIN JUNCTION RESISTANCE

(75) Inventors: Nian Yang, Mountain View, CA (US); Hiroyuki Ogawa, Sunnyvale, CA (US); Yider Wu, Campbell, CA (US); Kuo-Tung Chang, Saratoga, CA (US); Yu Sun, Saratoga, CA (US)

(73) Assignee: FASL LLC, Sunnyvale, CA (US)

( * ) Notice: Subject to any disclaimer, the term of this patent is extended or adjusted under 35 U.S.C. 154(b) by 0 days.

(21) Appl. No.: 10/758,173

(22) Filed: Jan. 14, 2004

(51) Int. Cl.
*H01L 23/62* (2006.01)

(52) U.S. Cl. .................. 257/355; 257/173; 361/90; 361/56

(58) Field of Classification Search ................ 257/173, 257/355; 361/90, 91, 91.1–91.8, FOR. 100
See application file for complete search history.

(56) References Cited

U.S. PATENT DOCUMENTS

| 5,514,892 A | * | 5/1996 | Countryman et al. | ....... 257/355 |
| 6,762,466 B1 | * | 7/2004 | Huang et al. | ............... 257/395 |
| 2003/0042499 A1 | * | 3/2003 | Reiner | ........................ 257/173 |

* cited by examiner

*Primary Examiner*—Nathan J. Flynn
*Assistant Examiner*—Scott R Wilson

(57) ABSTRACT

More efficient use of silicon area is achieved by incorporating an electrostatic discharge protective (ESDP) device beneath a pad area of a semiconductor structure. The pad area includes a substrate having a first metal layer above it. A second metal layer is above the first metal layer. The ESDP device resides in the substrate below the first metal layer. A layer of dielectric separates the first and second metal layers. A via within the dielectric layer electrically couples the first and second metal layers. A via connects to the ESDP component. Subsequent metal layers can be arranged between the first and second metal layers. The Ohmic value of the resistance component of the ESDP device can be set during fabrication by fixing a number of individual via components, arranged electrically in parallel, by fixing the cross sectional area of the via components, and/or by fixing the length of the via components.

13 Claims, 13 Drawing Sheets

Top side view

Top side view

ELECTROSTATIC DISCHARGE PERFORMANCE OF A SILICON STRUCTURE AND EFFICIENT USE OF AREA WITH ELECTROSTATIC DISCHARGE PROTECTIVE DEVICE UNDER THE PAD APPROACH AND ADJUSTMENT OF VIA CONFIGURATION THERETO TO CONTROL DRAIN JUNCTION RESISTANCE

TECHNICAL FIELD

Embodiments of the present invention relate to the field of semiconductor device design. More particularly, an embodiment of the present invention relates to improved electrostatic discharge performance and a more efficient use of wafer area with an electrostatic discharge protective device under a pad area and adjustment of via configuration thereto to control drain junction resistance.

BACKGROUND

The development of semiconductor circuit design and fabrication technologies has resulted in devices such as flash memories, integrated circuits, and logic and other devices of significant complexity and density and which operate at low voltages. Due to the scaling inherent in the design of such complex, dense semiconductor chips, the efficient use of the available silicon area without compromising performance or degrading physical characteristics becomes a significant consideration.

Some chip and wafer designs incorporate a pad area. The pad is typically an area where an interface between the integrated circuit and an external circuit or system can be established. Interfaces between the chip and the external circuits and/or systems can include, for instance, bonding, probing, and packaging. To effectively establish such interfaces, the pad area is typically large, relative to the internal circuit. The pad area thus occupies a significant area of the silicon on the chip.

The pad area is conventionally separated from other circuits in the chip. Separating the pad and the chip internal circuits facilitates probing, bonding, and packaging. The pad separated from them; circuits and devices characteristic of the chip's operation are elsewhere within the chip. FIG. 1 depicts the layout of a conventional semiconductor structure 10. Pad 11 and the active devices of internal circuits 12 of semiconductor device 10 are separated. The internal circuits 12 are located in a non-pad area 13.

Taking one advanced flash memory design as an example, the pad area takes up more area than half of a typical memory sector comprising 512 kilobits. One typical pad size is approximately 80 micrometers by 80 micrometers, thus covering 6,400 square micrometers. Where there are several pads on a chip, such as 40 pads for the exemplary flash memory chip, the amount of silicon area covered by the pad area becomes significant. For instance, the 40 pads on the exemplary flash memory chip, each covering 6,400 square micrometers, together cover over a half million square micrometers of silicon substrate.

Further, electrostatic discharge (ESD) performance is a factor that must be considered in the design of semiconductor structures. Electrical contact with external power sources, physical contact by external objects and other sources can cause potential differences, such as with respect to ground, to be introduced on the pad. The pad is where such contact can be more likely to occur than with respect to internal components of a semiconductor structure.

The pad is connected to internal components however, and introduction of high potentials on the pad can be expressed on components. Modern silicon devices operate at relatively low voltages, such as 1.8 Volts. Some rather common ESD events can introduce potentials on the order of 1,000 Volts or more. Their low operating voltages, constitution, configuration, and/or construction, and their increased circuit densities can render such silicon devices sensitive to the high potentials that can be introduced by ESD.

For instance, the sources and drains of complimentary metal oxide semiconductor (CMOS) transistors can be susceptible to damage. Their gates, which can typically comprise thin oxide films, can be particularly vulnerable. Other components can also be sensitive to the high potentials from ESD and/or to the instantaneous high currents they can introduce. Thus, many silicon structures incorporate ESD protection.

ESD protection can be provided by ESD protective devices, such as transistors. ESD protective devices can become conductive upon gating. ESD protective devices can be controlled by the sensing of a high potential introduction on the pad. Instantaneously sizable currents can flow through the ESD protection devices. This current, which though of short duration (e.g., on the order of $10^{-9}$ seconds) can be on the order of an amp or more. This high current can be dissipated in ESD protection resistors connected between the pad and ESD protection transistors, and in series between the sources and drains of ESD protection transistors, as it flows to a typically grounded Vss.

To provide adequate ESD protection, the junctions between the ESD protection resistors and the ESD protection transistors are typically tuned. Such tuning is typically accomplished by varying the resistance of the ESD resistors, such as by techniques employed in the fabrication process of the silicon structure. For handling the currents ESD events can introduce, ESD protection transistors and resistors are typically large, robust devices, relative to the faster transistors and other devices and components. Thus, ESD protection transistors and resistors can occupy a significant area of silicon.

For instance, referring again to FIG. 1, where internal circuits 12 comprise ESD protection transistors and resistors, their size and placement within non-pad area 13 is a typical factor in design and layout considerations for silicon structure 10. Further, their size can provide a constraint on the circuit density achievable for other circuits within silicon structure 10, such as those providing logic, memory, and other functions besides ESD protection.

However, chip size and operating voltages continue to be scaled down, and circuit density scaled up, as technology in the field advances. Thus, the significance of the silicon area covered by the pad area is becoming greater. Further, the impact of the size of ESD protection devices on the silicon area they command is becoming greater as well.

The pad typically has multiple layers of metal, the top layer of which is used for the bonding, probing, and packaging. Lower layers of metal are typically used for introducing pad signals in or out between the internal circuitry of the chip and, for instance, an external system. The bottom level of metal is directly connected to the silicon substrate comprising the chip. However, no active devices are present within the substrate beneath a typical pad.

SUMMARY

As denser, more complex chips are designed, and as operating voltages are reduced, more efficient use of silicon and improved electrostatic discharge protective performance can become desirable. A semiconductor structure with improved electrostatic discharge performance and a more efficient use of wafer area with an electrostatic discharge protective device under a pad area is disclosed.

An embodiment of the present invention more efficiently uses silicon area. In one embodiment of the present invention, a semiconductor structure such as a wafer of individual dies comprising a flash or a SRAM memory, an integrated circuit, or the like incorporates an electrostatic discharge protective (ESDP) device below the pad area. Adjustment of via configuration thereto sets the drain junction resistance of the ESDP device in one embodiment.

In one embodiment, a semiconductor structure has a pad area and has an electrostatic protection device disposed below the pad area. The ESDP device includes, in one embodiment, a transistor and a resistor. In one embodiment, the pad area includes a substrate with a first layer of metal disposed above it and a second layer of metal disposed above the first metal layer.

The ESDP device is disposed below the first layer of metal. In one embodiment, the semiconductor structure also has a layer of dielectric disposed between the first and second metal layers and a via disposed within the dielectric layer, which electrically couples the first and second metal layers. A via also connects to the ESDP device. In one embodiment, the via comprises a plurality of individual vias.

In one embodiment, the resistance comprising the ESDP device can be fixed during a process of fabricating the semiconductor structure. In one embodiment, the resistance comprising the electrostatic protection device comprises a portion of the plurality of individual vias, arranged electrically in parallel, one to another. In one embodiment, the resistance comprising the electrostatic protection device can be fixed by changing the number, length, and/or the size of the individual vias.

In one embodiment, subsequent layers of metal can be disposed between the first and second metal layers. One embodiment provides a pad area apparatus for a semiconductor structure that has an ESDP device disposed in a substrate beneath a metal layer. One embodiment provides an ESDP device disposed within substrate below a pad area of a semiconductor structure. One embodiment provides pad area of a semiconductor structure having an ESDP disposed below it. One embodiment provides a method for fabricating a semiconductor structure that includes a pad area and has an ESDP device beneath the pad area.

BRIEF DESCRIPTION OF THE DRAWINGS

The accompanying drawings, which are incorporated in and form a part of this specification, illustrate embodiments of the invention and, together with the description, serve to explain the principles of the invention. The drawings are not to scale.

DETAILED DESCRIPTION

A semiconductor structure with improved electrostatic discharge performance and a more efficient use of wafer area with an electrostatic discharge protective device under a pad area is disclosed. In the following detailed description of the present invention, numerous specific details are set forth in order to provide a thorough understanding of the present invention. However, it will be recognized by one skilled in the art that the present invention may be practiced without these specific details or with equivalents thereof. In other instances, well known methods, processes, procedures, components, and circuits have not been described in detail as not to unnecessarily obscure aspects of the present invention.

Portions of the detailed descriptions of embodiments of the invention that follow are presented and discussed in terms of processes. Although specific steps and sequence thereof are disclosed in figures herein (e.g., FIGS. 8–12) describing the operations of these processes (e.g., processes 80, 90, 100, 1100, and 1200), such steps and sequence are exemplary. Embodiments of the present invention are well suited to performing various other steps or variations of the steps recited in the flowcharts of the figures herein, and in another sequence than the sequence depicted and described.

The present invention is discussed primarily in the context of a more efficient use of wafer area with a device under the pad. In one embodiment, a semiconductor structure has a pad area and has an active device of the semiconductor structure disposed beneath the pad area. By incorporating a device beneath the pad area, an embodiment of the present invention improves efficiency of the use of silicon area. Fabrication of semiconductor structures according to an embodiment of the present invention provides economic benefits concomitant with improved yield of individual dies available from a wafer.

Exemplary Structures

Figure 1:
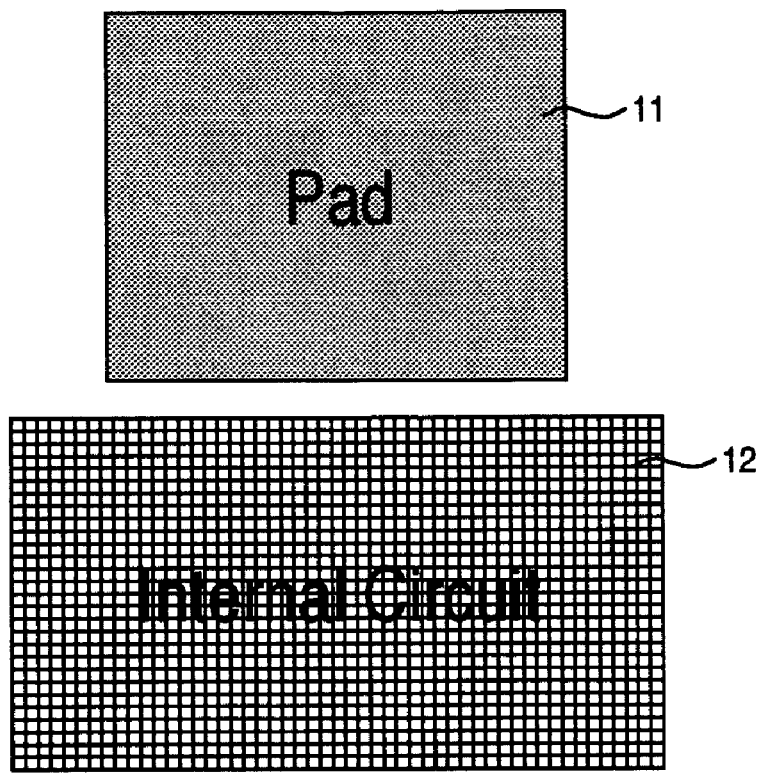
FIG. 1 depicts a top view of a conventional semiconductor structure.
Figure 2:
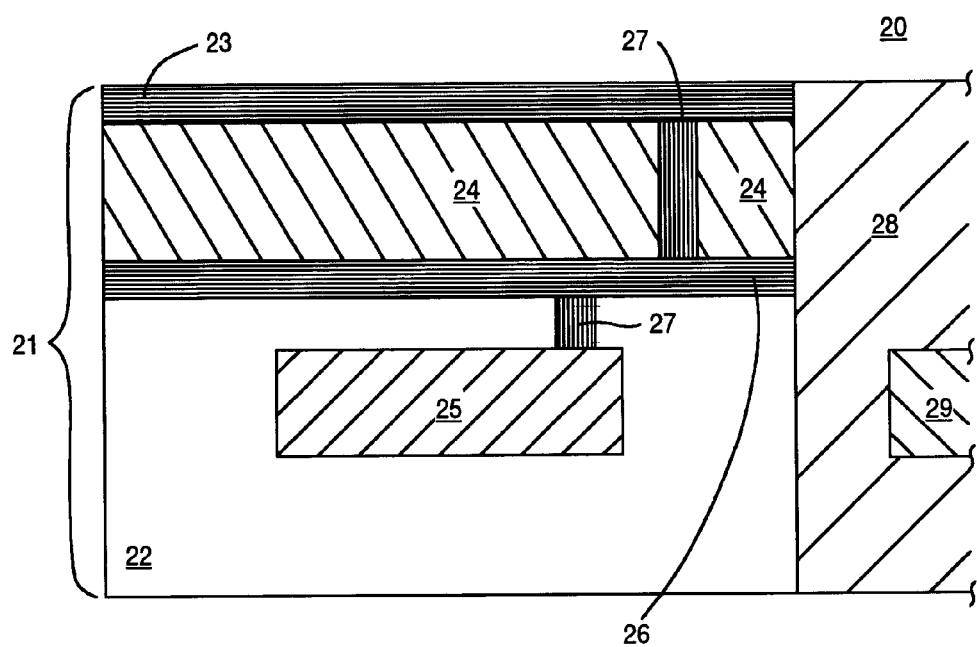
FIG. 2 depicts a cross section of a semiconductor structure having an active component under the pad area, according to one embodiment of the present invention.

FIG. 2 depicts a cross section of a semiconductor structure 20, according to one embodiment of the present invention.

Semiconductor structure 20 has a pad area 21 bordering a non-pad area 28. Non-pad area 28 is bounded, at least in part, by pad area 21. Semiconductor structure 20 has an electrostatic discharge protective (ESDP) device 25 disposed beneath pad area 21. ESDP device 25 can comprise, for instance, an ESDP transistor. ESDP device 25 can be one of several components of semiconductor structure 20. For instance, an active device 29 can be disposed within the non-pad area 28.

The pad area 21 includes a substrate 22. Substrate 22 has a first layer of metal 26, which is disposed above it. Metal layer 26 comprises a bottom metal (M1) layer, in one embodiment. Substrate 22 also has a second layer of metal 23, which is disposed above the first layer of metal 26. The ESDP device 25 is disposed below the first layer of metal 26. In one embodiment, the semiconductor structure 20 also has a layer of dielectric 24, which is disposed between second metal layer 23 and first metal layer 26. In one embodiment, a via 27 is disposed within the dielectric layer 24. Via 27 electrically couples the second metal layer 23 and first metal layer 26. In one embodiment, a via 27 connects to the ESDP device 25. Subsequent layers of metal can also be disposed between the first metal layer 26 and the second metal layer 23.

In one embodiment, substrate 22 comprises silicon. In one embodiment, the dielectric layer 24 is an interlayer dielectric (ILD) and can comprise a material such as tetraethoxysilane (TEOS), a similar dielectric material, or another dielectric material. The metal layers 23 and 26 (and any interlying metal layers) and via 27 can comprise any conductive metal, including but not limited to copper, aluminum, gold, silver, tungsten, or any other conductive metal, or another conductive material, such as polycrystalline silicon (POLY) and tungsten silicide, among others.

Figure 3:
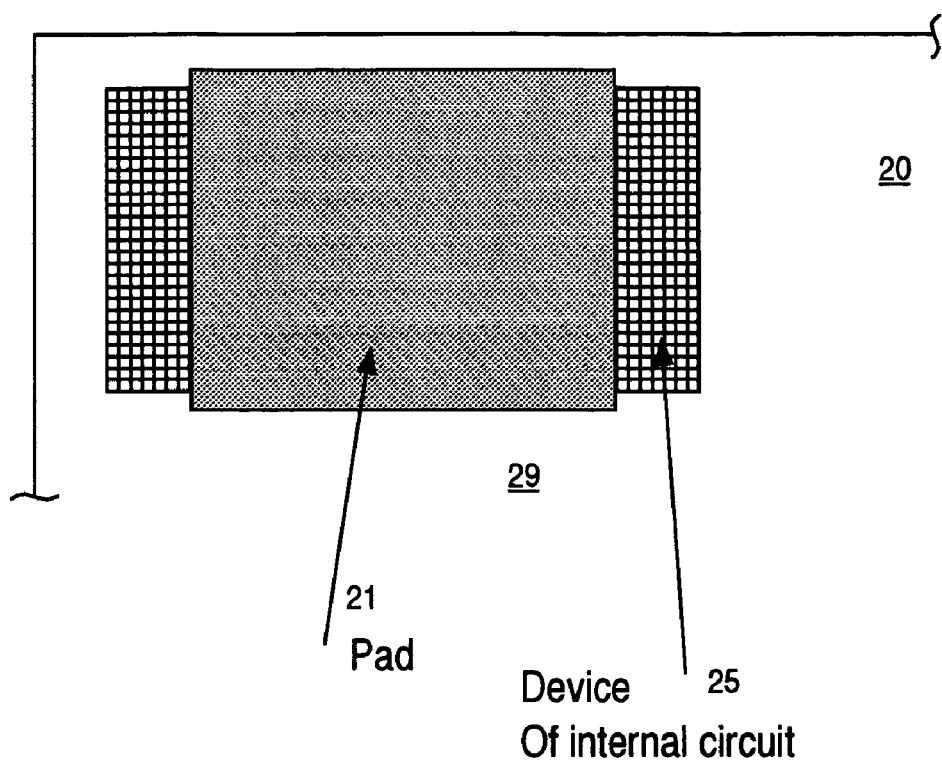
FIG. 3 depicts a top view of a semiconductor structure having an active device under the pad area, according to one embodiment of the present invention.

FIG. 3 depicts a top view of semiconductor structure 20 having an ESDP device under the pad 21 area, according to one embodiment of the present invention. Pad area 21 bounds a portion of non-pad area 29 of semiconductor device 20. In one exemplary embodiment, semiconductor device 20 comprises a flash memory.

In such a flash memory, the pad size can be approximately 80 micrometers by 80 micrometers and the vertical size of semiconductor device 20 can be approximately 3,000 micrometers. In one exemplary implementation, 100 individual dies (e.g., individual active components) may be singulated from the non-pad area 29 of semiconductor structure 20 and, for instance three more individual ESDP components from beneath the pad area 21. In the present implementation, this results in a three percent increase in devices over a semiconductor structure with no such ESDP components located beneath its pad area.

Figure 4:
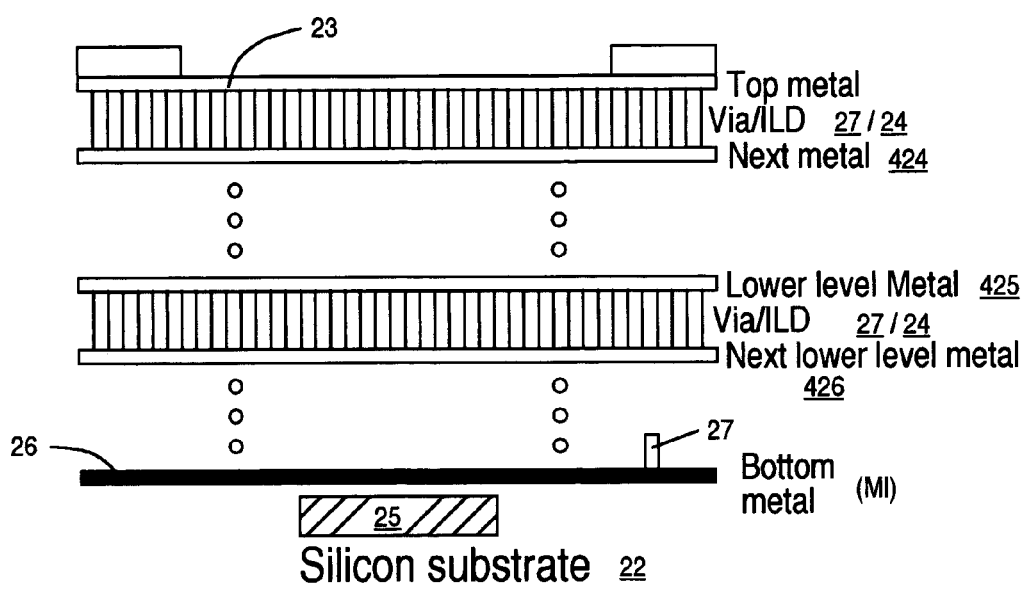
FIG. 4 depicts a cross section of a pad area having an active device there under, according to one embodiment of the present invention.

FIG. 4 depicts a cross section of a pad area 400 having an active device 25 there under, according to one embodiment of the present invention. Pad area 400 is disposed above a silicon substrate 22, wherein an ESDP device 25 is disposed.

A top layer of metal 23 forms an upper surface of pad area 400, in one embodiment. In another embodiment, top metal layer 23 can have a layer of another material, such as a coating, over it. A second metal layer 424 is disposed below top metal layer 23. An interlayer dielectric (ILD) 24 is disposed between top metal layer 23 and second metal layer 424. Top metal layer 23 and second metal layer 424 are electrically interconnected by via 27, which in one embodiment comprises a plurality of individual vias.

Below second metal layer 424, a third metal layer 425 is disposed. A fourth metal layer 426 is disposed below third metal layer 425. An interlayer dielectric (ILD) 24 is disposed between third metal layer 425 and fourth metal layer 426. Third metal layer 425 and fourth metal layer 426 are electrically interconnected by via 27, which in one embodiment comprises a plurality of individual vias. A via 27 can electrically couple third layer of metal 425 and second layer of metal 424.

A bottom metal (M1) layer 26 is disposed over silicon substrate 22, and below fourth metal layer 426. In one embodiment, any number of additional metal layers can be disposed above bottom metal layer 26 and below fourth metal layer 426. An interlayer dielectric (ILD) 24 can be disposed between each of the additional metal layers, between one of the additional metal layers and bottom metal layer 26 and/or fourth metal layer 426, and/or between the third metal layer 425 and second metal layer 424.

A via 27 can electrically intercouple any of the additional metal layers and/or electrically couple them to any other metal layer, such as to bottom metal layer 26, or to fourth metal layer 426. A via 27 can electrically couple bottom metal layer 26 with any of the metal layers disposed above it. A via 27 can electrically couple active device 25 with any metal layer, such as bottom metal layer 26 or any metal layer disposed above it.

Figure 5:
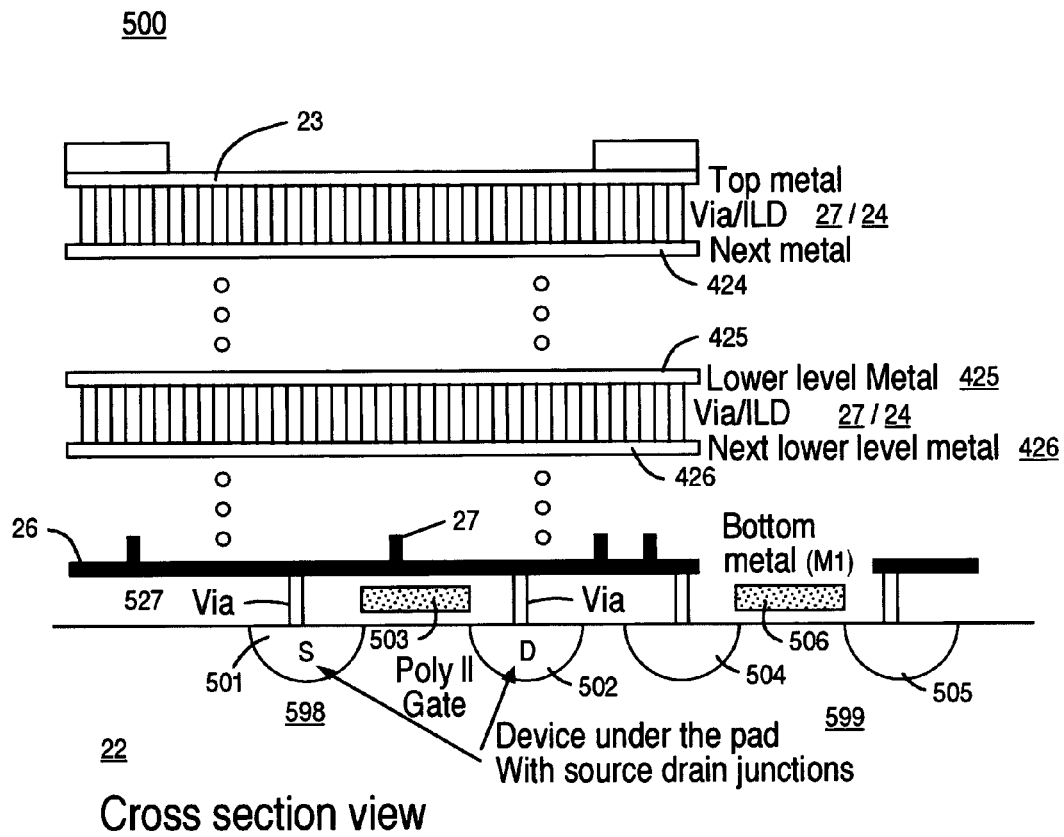
FIG. 5 depicts a cross section of a pad area having as active devices there under two transistors, according to one embodiment of the present invention.

FIG. 5 depicts a cross section of a pad area 500 having as ESDP devices there under two ESDP transistors 598 and 599, according to one embodiment of the present invention. ESDP Transistors 598 and 599 are disposed within a silicon substrate 22 beneath pad area 500. Pad area 500 has a bottom (M1) layer of metal 26 disposed above substrate 22.

ESDP transistor 598 comprises a source region 501 and a drain region 502, disposed within appropriately doped areas of substrate 22. Source region 501 and drain region 502 are each electrically coupled to bottom metal layer 26 (or to another metal layer) by an individual via 527. Transistor 598 also comprises a gate 503, which can be of a polycrystalline silicon II (POLY-II) or another gate material disposed above and between source region 501 and gate region 502, and beneath bottom metal layer 26.

ESDP transistor 599 comprises a source region 504 and a drain region 505, disposed within appropriately doped areas of substrate 22. Source region 504 and drain region 505 are each electrically coupled to bottom metal layer 26 (or to another metal layer) by an individual via 527. ESDP Transistor 599 also comprises a gate 506, which can be of a POLY-II or another gate material disposed above and between source region 504 and gate region 505, and beneath bottom metal layer 26.

In one embodiment, a top layer of metal 23 forms an upper surface of pad area 500. In some embodiments, metal layer 23 can have a coating, oxide, etc. disposed upon it. A second metal layer 424 is disposed below top metal layer 23. An interlayer dielectric (ILD) 24 is disposed between top metal layer 23 and second metal layer 424. Top metal layer 23 and second metal layer 424 are electrically interconnected by via 27, which in one embodiment comprises a plurality of individual vias.

Below second metal layer 424, a third metal layer 425 is disposed. A fourth metal layer 426 is disposed below third metal layer 425. An interlayer dielectric (ILD) 24 is disposed between third metal layer 425 and fourth metal layer 426. Third metal layer 425 and fourth metal layer 426 are electrically interconnected by via 27, which in one embodiment comprises a plurality of individual vias. A via 27 can electrically couple third layer of metal 425 and second layer of metal 424.

A bottom metal (M1) layer 26 is disposed over silicon substrate 22, and below fourth metal layer 426. In one embodiment, any number of additional metal layers can be disposed above bottom metal layer 26 and below fourth metal layer 426. An interlayer dielectric (ILD) 24 can be disposed between each of the additional metal layers, between one of the additional metal layers and bottom metal layer 26 and/or fourth metal layer 426, and/or between the third metal layer 425 and second metal layer 424. A via 27 can electrically intercouple any of the additional metal layers and/or electrically couple them to any other metal layer, such as to bottom metal layer 26, or to fourth metal layer 426. A via 27 can electrically couple bottom metal layer 26 with any of the metal layers disposed above it.

Exemplary ESD Protective Device

Figure 6:
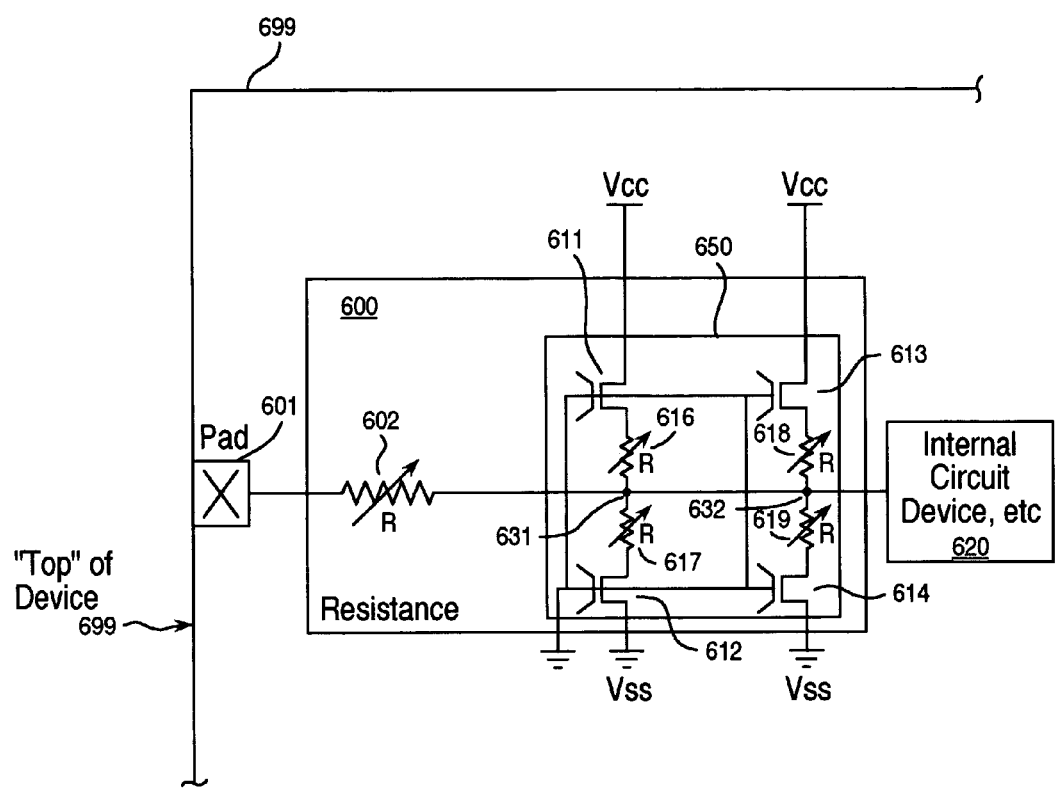
FIG. 6 depicts an electrostatic discharge protection device, according to one embodiment of the present invention.

FIG. 6 depicts an exemplary electrostatic discharge (ESD) protection device 600, according to one embodiment of the present invention. ESD protection (ESDP) device 600 is disposed, in one embodiment, below the area of pad 601, on a semiconductor structure 699. Pad 601 is electrically coupled to internal device 620 (e.g., a device, circuit, component, etc.) of semiconductor structure 699 through ESDP device 600. In the event that a high potential is introduced at pad 601, ESDP device 600 functions to provide a degree of protection for internal device 620 from its effects.

Thus, the components of ESDP device 600 that are described below, as well as the electrical junctions and any conductive paths between them, comprise components capable of withstanding and dissipating the effects of ESD. This capability can be ascribed, for instance, to electrical, physical, and/or material characteristics of these components (e.g., or be conferred thereby). Such characteristics are known in the art.

Exemplary ESDP device 600 comprises a resistance 602. The resistive (e.g., Ohmic) value of resistance 602 can be varied over a range suitable for performing ESDP functions for a variety of entities that can characterize internal circuit 620. For instance, in one exemplary implementation, resistance 602 can have a resistive value on the order of 50 Ohms. Resistance 602 is connected to internal circuit 620 through an ESDP network 650. Resistance 602, in one embodiment, can comprise a plurality of vias connected in parallel between pad 601 and ESDP network 650.

Resistance 602 is electrically coupled to ESDP network 650 at the junction 631 of resistances 616 and 617 and at the junction 632 of resistances 618 and 619. Resistance 617 can comprise a plurality of vias connected in parallel between junction 631 and the drain of transistor 612. ESDP network 650 is electrically coupled to internal device 620 at junction 632.

ESDP network 650 comprises four transistors, 611–614. The gates of each of transistors 611–614 are electrically coupled to ground. The drain of transistor 611 is connected to Vcc and its source is connected to resistance 616. Resistance 616 is connected in series with resistance 617. Resistance 617 is connected to the drain of transistor 612, the source of which is connected to Vss, which can be grounded. The drain of transistor 613 is connected to Vcc and its source is connected to resistance 626. Resistance 626 is connected in series with resistance 627. Resistance 627 is connected to the drain of transistor 614, the source of which is connected to Vss.

In the following description of resistances 616–619 (and of resistance 602 below), their individual Ohmic values are discussed collectively. However, the individual Ohmic values of resistances 616–619 can be the same or they can differ. The Ohmic values of resistances 616–619 can be varied over a range suitable to tune junctions 631 and 632, ESDP network 650, and/or ESDP device 600, for performing their ESDP functions for a variety of entities that can characterize internal circuit 620. Resistances 616–619, in one embodiment, can comprise pluralities of vias.

For instance, resistance 616 can comprise a plurality of vias connected in parallel between junction 631 and the source of transistor 611. Resistance 617 can comprise a plurality of vias connected in parallel between junction 631 and the drain of transistor 612. Resistance 618 can comprise a plurality of vias connected in parallel between junction 632 and the source of transistor 613. Resistance 617 can comprise a plurality of vias connected in parallel between junction 632 and the drain of transistor 614.

The Ohmic values of resistance 602 and of resistances 616–619, individually or collectively, can differ. The Ohmic values of any or all of these resistances can be configurable during the process of fabricating ESDP device 600. For instance, in one implementation, the Ohmic values of these resistances can be configurable by setting certain numbers of vias for their pluralities, each via of the pluralities having an individual Ohmic value. In a second implementation, the Ohmic values of these resistances can be configurable by setting a certain gauge for the cross-sectional area of each via of the plurality. In a third implementation, the Ohmic value of these resistances can be configurable by setting a certain length for the plurality, the individual vias of the plurality each having substantially that same length. In other implementations, the Ohmic value of these resistances can be configurable by various combinations of the three implementations discussed instantly above.

Figure 7:
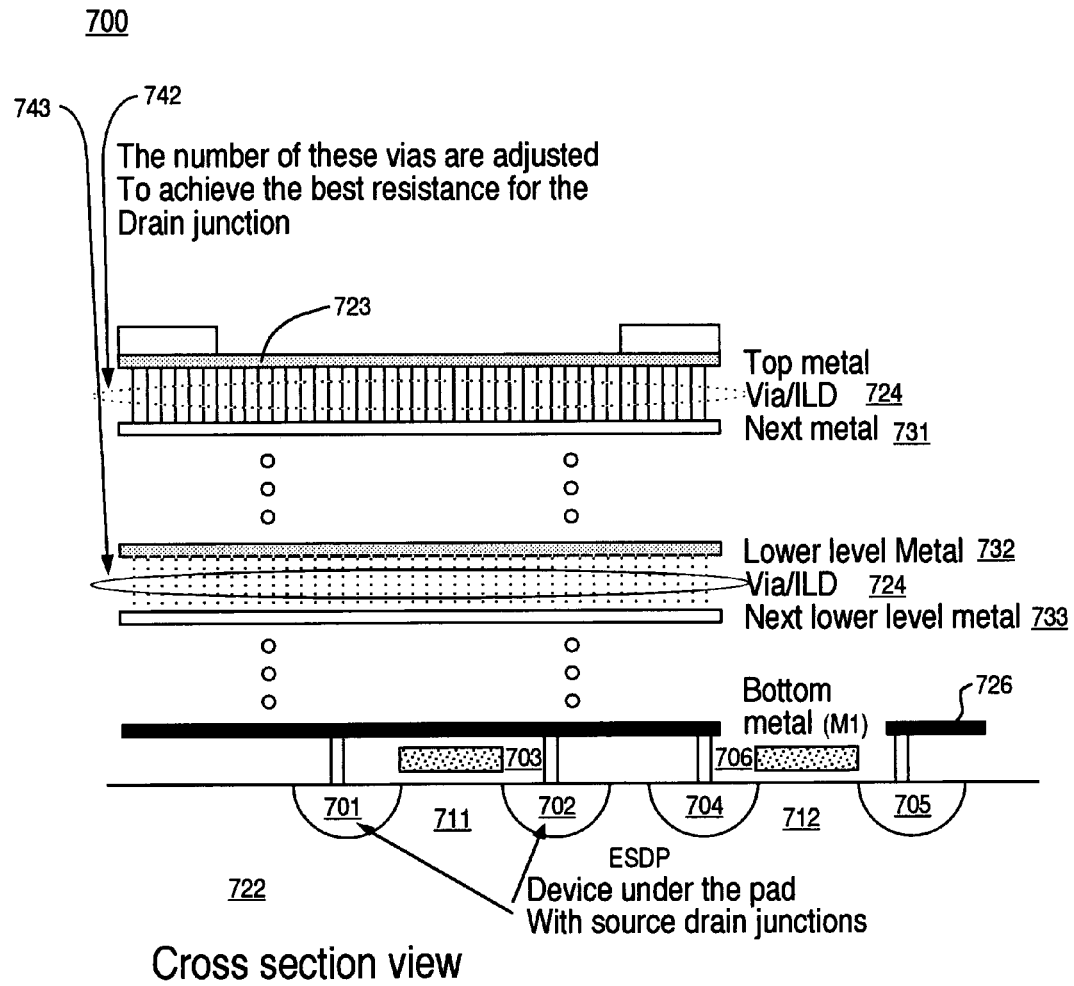
FIG. 7 depicts an electrostatic discharge protection device disposed below a pad area with a resistance fixable by setting of the cross sectional area, length, and/or number of vias, according to one embodiment of the present invention.

FIG. 7 depicts a cross section of a pad area 700, according to one embodiment of the present invention. ESDP transistors 711 and 712 are disposed within silicon substrate 722 below pad area 700. ESDP transistors 711 and 712 comprise components of an ESDP device such as exemplary ESDP device 600 (FIG. 6). Pad area 700 has a bottom (M1) layer of metal 726 disposed above substrate 722.

ESDP transistor 711 comprises a source region 701 and a drain region 702, disposed within appropriately doped areas of substrate 22. ESDP transistor 711 also comprises a gate 703, which can be of a polycrystalline silicon II (POLY-II) or another gate material disposed above and between source region 701 and drain region 702, and beneath bottom metal layer 726. ESDP transistor 712 comprises a source region 704 and a drain region 705, disposed within appropriately doped areas of substrate 722. ESDP transistor 712 also comprises a gate 706, which can be of a POLY-II or another gate material disposed above and between source region 704 and drain region 705, and beneath bottom metal layer 726.

In one embodiment, a top layer of metal 723 forms an upper surface of pad area 700. Metal layer 723 can have a coating, oxide, etc. disposed upon it. A second metal layer 731 is disposed below top metal layer 723. An interlayer dielectric (ILD) 724 is disposed between top metal layer 723 and second metal layer 731. Top metal layer 723 and second metal layer 724 are electrically interconnected by via 742, which in one embodiment comprises a plurality of individual vias.

Below second metal layer 731, a third metal layer 732 is disposed. A fourth metal layer 733 is disposed below third metal layer 732. An interlayer dielectric (ILD) 724 is disposed between third metal layer 732 and fourth metal layer 733. Third metal layer 732 and fourth metal layer 733 are electrically interconnected by via 743, which in one embodiment comprises a plurality of individual vias. Another via can electrically couple third layer of metal 732 and second layer of metal 731.

A bottom metal (M1) layer 726 is disposed over silicon substrate 722, and below fourth metal layer 733. In one embodiment, any number of additional metal layers can be disposed above bottom metal layer 726 and below fourth metal layer 733. An ILD can be disposed between each of the additional metal layers, between one of the additional metal layers and bottom metal layer 726 and/or fourth metal layer 733, and/or between the third metal layer 732 and second metal layer 731. Other vias can electrically intercouple any of the additional metal layers and/or electrically couple them to any other metal layer, such as to bottom metal layer 726, or to fourth metal layer 733. Yet another via can electrically couple bottom metal layer 726 with any of the metal layers disposed above it.

The Ohmic values of vias 724, individually or collectively, can differ. The Ohmic values of any or all of these via 724 resistances can be configurable during the process of fabricating ESDP device 700. For instance, in one implementation, the Ohmic values of these resistances can be configurable by setting certain numbers of vias 724 for their pluralities, each via of the pluralities of vias 724 having an individual Ohmic value. In a second implementation, the Ohmic values of these resistances can be configurable by setting a certain gauge for the cross-sectional area of each via of the plurality of vias 724. In a third implementation, the Ohmic value of these resistances can be configurable by setting a certain length for the plurality of vias 724, the individual vias of the plurality 724 each having substantially that same length. In other implementations, the Ohmic value of these resistances can be configurable by various combinations of the three implementations discussed instantly above.

Exemplary Processes

The methods described below explain processes for fabricating a semiconductor structure with a pad area and a pad area for a semiconductor structure, with electrostatic discharge protective devices below the pad area. These processes can be implemented using techniques that are well known in the art, and which are not described herein in detail, so as not to unnecessarily obscure features of an embodiment of the present invention. For example, step 81 of process 80 (FIG. 8) comprises forming a substrate. Formation of a substrate is well known in the art, and any applicable technique may be used to accomplish step 81. Any such known techniques can be applied as appropriate so as to practice an embodiment of the present invention.

Further, the processes described below are discussed for simplicity and brevity in terms of individual steps, listed in an exemplary sequence. Although specific steps and sequence thereof are disclosed in the figures discussed herein (e.g., FIGS. 8–12) describing the operations of these processes (e.g., processes 80, 90, 100, 1100, and 1200), such steps and sequences are exemplary. Embodiments of the present invention are well suited to performing various other steps or variations of the steps recited in the flowcharts of the figures herein, and in a sequence other than the sequence depicted and described herein.

Figure 8:
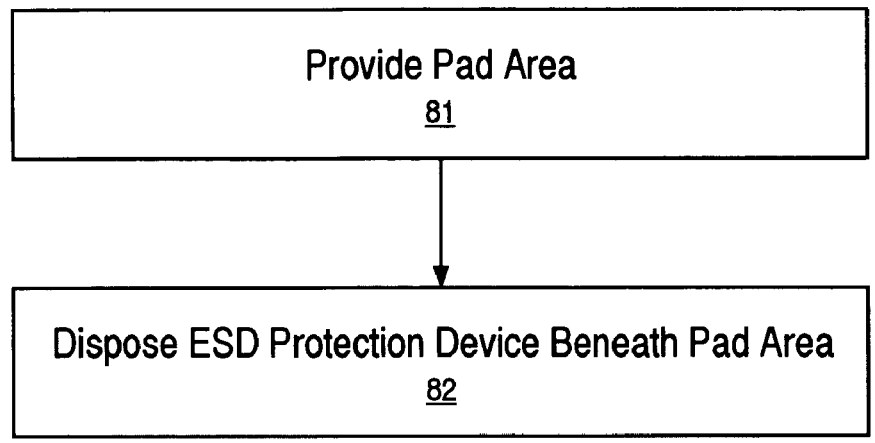
FIG. 8 is a flowchart of a method for fabricating a semiconductor structure, according to one embodiment of the present invention.

Exemplary Processes for Fabricating a Semiconductor Structure with ESD Protection FIG. 8 is a flowchart of a method 80 for fabricating a semiconductor structure with electrostatic discharge protection, according to one embodiment of the present invention. Process 80 begins with a step 81, wherein a pad area is provided. In step 82, an electrostatic discharge protection device, such as a transistor and/or resistor for example, is disposed beneath the pad area, completing process 80.

Figure 9:
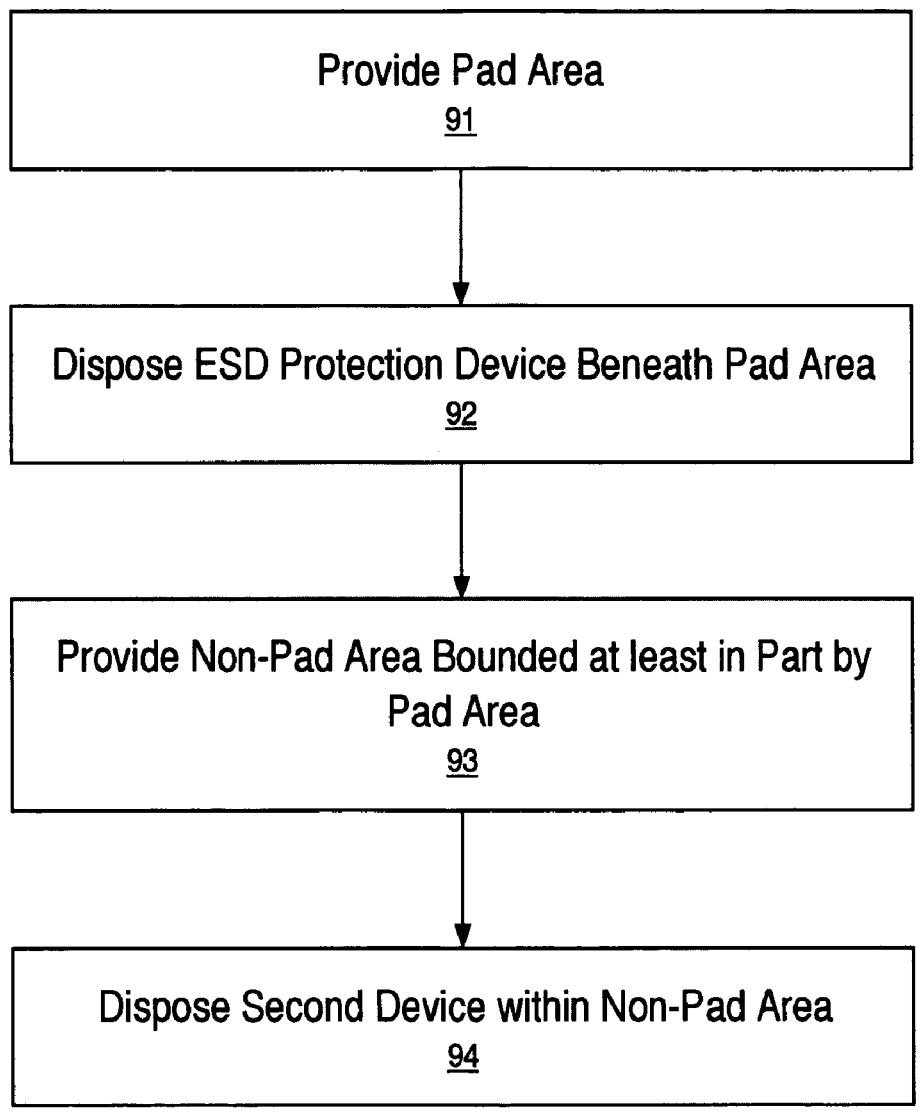
FIG. 9 is a flowchart of a method for fabricating a semiconductor structure, according to one embodiment of the present invention.

FIG. 9 is a flowchart of a method 90 for fabricating a semiconductor structure, according to one embodiment of the present invention. Process 90 begins with a step 91, wherein a pad area is provided. In step 92, an electrostatic discharge protection (ESDP) device is disposed beneath the pad area.

In step 93, a non-pad area is provided, such that the non-pad area is bounded at least in part by the pad area. In step 94, a second component (e.g., and active device, circuit, etc.) is disposed within the non-pad area, completing process 90.

Figure 10:
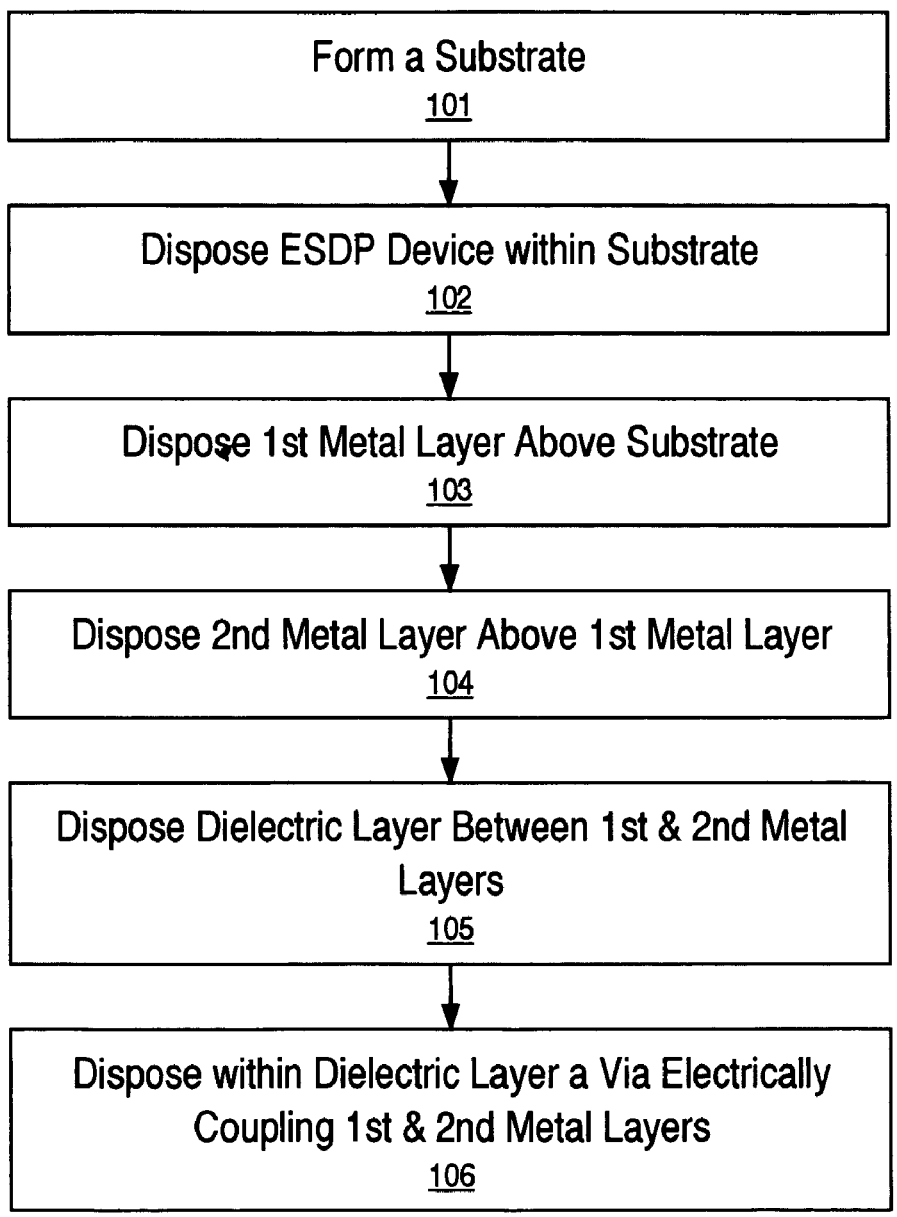
FIG. 10 is a flowchart of a method for fabricating a pad area, according to one embodiment of the present invention.

Exemplary Processes for Fabricating a Pad Area with ESDP Disposed Below FIG. 10 is a flowchart of a method 100 for fabricating a pad area for a semiconductor structure with an electrostatic discharge protection (ESDP) device below it, according to one embodiment of the present invention. Process 100 begins with step 101, wherein a substrate is formed. In step 102, an ESDP device such as a transistor is disposed within the substrate.

In step 103, a first layer of metal is disposed above the substrate. The first metal layer, in one embodiment, comprises a bottom (M1) metal layer disposed over the substrate. In step 104, a second metal layer is disposed above the first metal layer, completing process 100.

Figure 11:
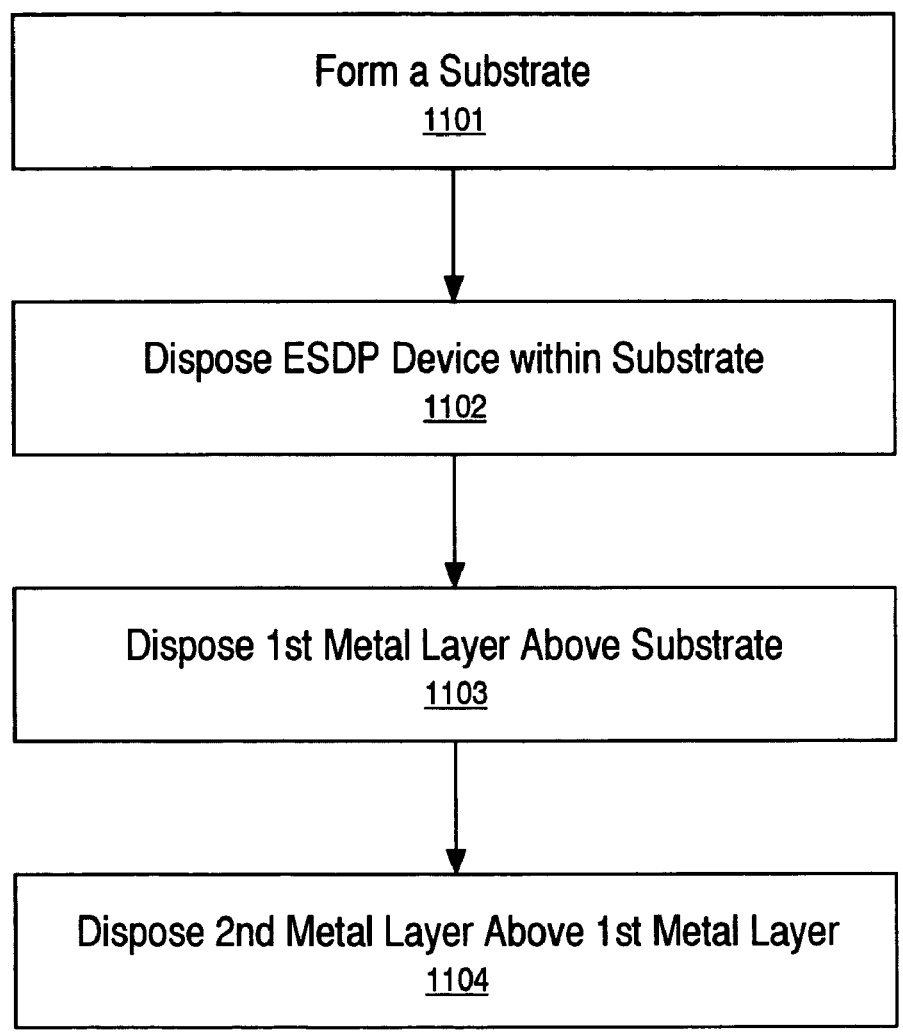
FIG. 11 is a flowchart of a method for fabricating a pad area, according to one embodiment of the present invention.

FIG. 11 is a flowchart of a method 1100 for fabricating a pad area for a semiconductor structure, according to one embodiment of the present invention. Process 1100 begins with step 1101, wherein a substrate is formed. In step 1102, an ESDP device such as a transistor is disposed within the substrate.

In step 1103, a first layer of metal is disposed above the substrate. The first metal layer, in one embodiment, comprises a bottom (M1) metal layer disposed over the substrate. In step 1104, a second metal layer is disposed above the first metal layer.

In step 1105, a dielectric layer such as an interlayer dielectric (ILD) is disposed between the first and second metal layers. In step 96, a via is disposed within the dielectric layer so as to electrically couple the first and second metal layers. In step 1107, a via is disposed within the substrate and below the first metal layer, so as to electrically couple the ESDP device to a metal layer, completing process 90.

Figure 12:
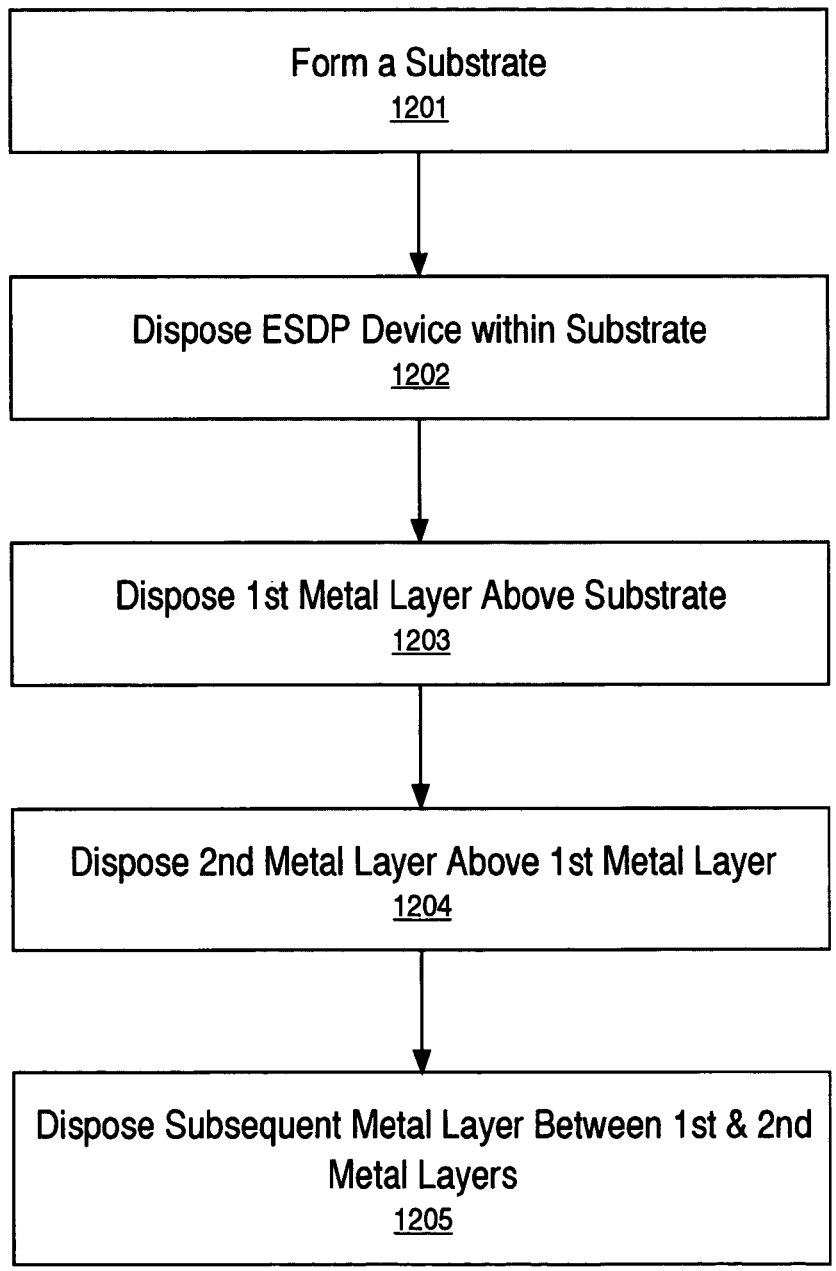
FIG. 12 is a flowchart of a method for fabricating a pad area, according to one embodiment of the present invention.

FIG. 12 is a flowchart of a method 1200 for fabricating a pad area for a semiconductor device, according to one embodiment of the present invention. Process 1200 begins with step 1201, wherein a substrate is formed. In step 1202, an ESDP device is disposed within the substrate.

In step 1203, a first layer of metal is disposed above the substrate. The first metal layer, in one embodiment, comprises a bottom (M1) metal layer disposed over the substrate. In step 1204, a second metal layer is disposed above the first metal layer.

In step 1205, a subsequent metal layer is disposed between the first and second metal layers, in one embodiment, completing process 1200. In another embodiment, dielectric layers can be disposed so as to electrically separate metal layers. In yet another embodiment, a via can be disposed within the dielectric so as to electrically couple metal layers one to another and/or to the ESDP device.

Exemplary Process for Fabricating an ESDP Device

Figure 13:
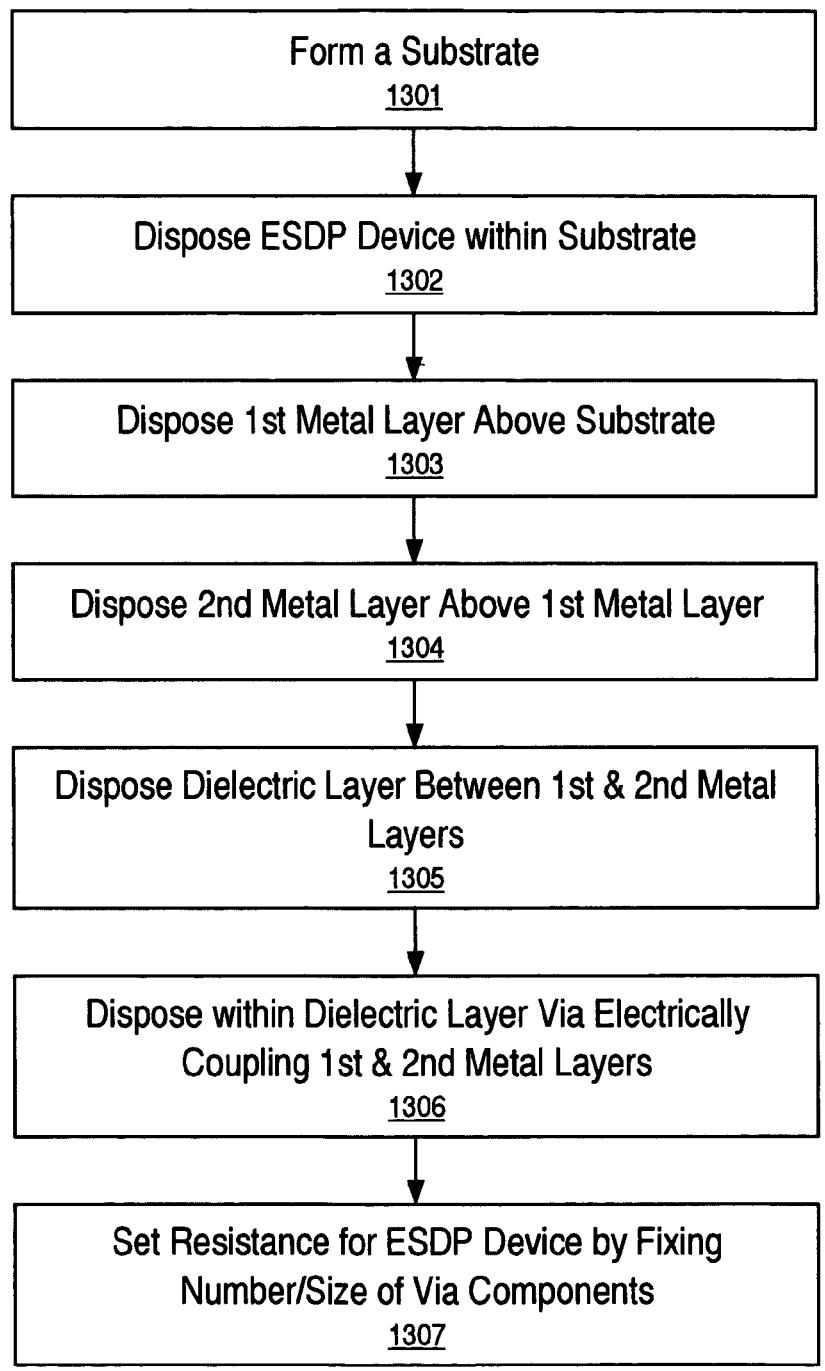
FIG. 13 is a flowchart of a method for fabricating a pad area for a semiconductor structure, according to one embodiment of the present invention.

FIG. 13 is a flowchart of a method 1300 for fabricating a pad area for a semiconductor structure, according to one embodiment of the present invention. Process 1300 begins with step 1301, wherein a substrate is formed. In step 1302, an ESDP device such as a transistor is disposed within the substrate.

In step 1303, a first layer of metal is disposed above the substrate. The first metal layer, in one embodiment, comprises a bottom (M1) metal layer disposed over the substrate. In step 1304, a second metal layer is disposed above the first metal layer.

In step 1305, a dielectric layer such as an interlayer dielectric (ILD) is disposed between the first and second metal layers. In step 96, a via is disposed within the dielectric layer so as to electrically couple the first and second metal layers. In step 1306, a via is disposed within the substrate and below the second metal layer, so as to electrically couple the ESDP device to a metal layer.

In step 1307, the resistance comprising the ESDP device is set by fixing the number of individual via components thereto configured electrically in parallel, the via components comprising the resistance, by fixing the cross sectional area of the individual via components thereto, and/or by fixing the length of the individual via components thereto, completing process 1300.

An embodiment of the present invention, a more efficient use of wafer area with an electrostatic discharge protective device under the pad, is thus described. While the present invention has been described in particular embodiments, it should be appreciated that the present invention should not be construed as limited by such embodiments, but rather construed according to the following claims.

What is claimed is:

1. A semiconductor structure comprising:
   a pad area;
   an electrostatic discharge protective device disposed directly below said pad area, said electrostatic discharge protective device comprising a transistor and a resistance, wherein said pad area comprises:
      a substrate;
      a first layer of metal disposed above said substrate wherein said electrostatic discharge protective device is disposed below said first layer of metal; and
      a second layer of metal disposed above said first layer of metal;
   a layer of dielectric disposed between said first metal layer and said second metal layer; and
   a via disposed within said dielectric layer wherein said via electrically couples said first and said second metal layer, wherein said via comprises a plurality of individual vias, wherein said resistance comprises a portion of said plurality of individual vias, wherein said individual vias comprising said portion are arranged electrically in parallel one to another and wherein a resistive value of said resistance is configured during a process for fabricating said semiconductor structure, wherein said resistive value of said resistance is fixed therein with setting a particular number for said portion of said plurality of individual vias in parallel and wherein said setting tunes said electrostatic discharge protective device for performing an electrostatic discharge protective function.

2. The semiconductor structure as recited in claim 1 further comprising a subsequent layer of metal between said first and said second metal layers.

3. The semiconductor structure as recited in claim 1 wherein said resistive value of said resistance is fixed with forming said individual vias comprising said portion of said plurality of individual vias with a particular cross sectional area.

4. The semiconductor structure as recited in claim 1 wherein said resistive value of said resistance is fixed with forming said individual vias comprising said portion of said plurality of individual vias with a particular length.

5. A pad area apparatus for a semiconductor structure comprising:
   a substrate;
   a first layer of metal disposed above said substrate;
   a second layer of metal disposed over said first layer of metal;
   an electrostatic discharge protective device wherein said electrostatic discharge protective device is disposed within said substrate directly below said pad area and wherein said electrostatic discharge protective device comprises a transistor and a resistance;
   a layer of dielectric disposed between said first metal layer and said second metal layer; and
   a via disposed within said dielectric layer wherein said via electrically couples said first and said second metal layer, wherein said via comprises a plurality of individual vias, wherein said resistance comprises a portion of said plurality of individual vias, wherein said individual vias comprising said portion are arranged electrically in parallel one to another and wherein a resistive value of said resistance is configured during a process for fabricating said semiconductor structure, wherein said resistive value of said resistance is fixed therein with setting a particular number for said portion of said plurality of individual vias in parallel and wherein said setting tunes said electrostatic discharge protective device for performing an electrostatic discharge protective function.

6. The pad area apparatus as recited in claim 5 wherein said resistive value of said resistance is fixed with forming said individual vias comprising said portion of said plurality of individual vias with a particular cross sectional area.

7. The pad area apparatus as recited in claim 5 wherein said resistive value of said resistance is fixed with forming said individual vias comprising said portion of said plurality of individual vias with a particular length.

8. An electrostatic discharge protective device for a semiconductor structure comprising:
   a resistance; and
   a transistor disposed within a substrate directly below a pad area of said semiconductor structure, wherein said resistance comprises a plurality of vias of said semiconductor structure, wherein said vias are arranged electrically in parallel, one to another, and wherein a resistive value of said resistance is configured during a process for fabricating said semiconductor structure wherein said resistive value of said resistance is fixed with setting a particular number for said portion of said plurality of individual vias in parallel and wherein said setting tunes said electrostatic discharge protective device for performing an electrostatic discharge protective function.

9. The electrostatic discharge protective device as recited in claim 8 wherein said resistive value of said resistance is fixed with forming said individual vias comprising said portion of said plurality of individual vias with a particular cross sectional area.

10. The electrostatic discharge protective device as recited in claim 8 wherein said resistive value of said resistance is fixed with forming said individual vias comprising said portion of said plurality of individual vias with a particular length.

11. A method of fabricating an semiconductor structure, comprising:
- disposing a pad area upon a substrate;
- disposing an electrostatic discharge protective device directly below said pad area, said electrostatic discharge protective device comprising a transistor and a resistance, wherein said pad area comprises:
  - a first layer of metal disposed above said substrate wherein said electrostatic discharge protective device is disposed below said first layer of metal; and
  - a second layer of metal disposed above said first layer of metal;
- disposing a layer of dielectric between said first metal layer and said second metal layer; and
- disposing a via within said dielectric layer wherein said via electrically couples said first and said second metal layer, wherein said via comprises a plurality of individual vias wherein said resistance comprises a portion of said plurality of individual vias, wherein said individual vias comprising said portion are arranged electrically in parallel one to another wherein said disposing a via comprises actively configuring a resistive value of said resistance, wherein said resistive value of said resistance is fixed therein with setting a particular number for said portion of said plurality of individual vias in parallel and wherein said setting tunes said electrostatic discharge protective device for performing an electrostatic discharge protective function.

12. The method as recited in claim 11 wherein said resistive value of said resistance is further fixed with forming said individual vias comprising said portion of said plurality of individual vias with a particular cross sectional area.

13. The method as recited in claim 11 wherein said resistive value of said resistance is further fixed with forming said individual vias comprising said portion of said plurality of individual vias with a particular length.

* * * * *